US010355443B2

(12) United States Patent
Egawa

(10) Patent No.: US 10,355,443 B2
(45) Date of Patent: Jul. 16, 2019

(54) ILLUMINATION DEVICE AND PROJECTOR

(71) Applicant: SEIKO EPSON CORPORATION, Tokyo (JP)

(72) Inventor: Akira Egawa, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 6 days.

(21) Appl. No.: 15/832,433

(22) Filed: Dec. 5, 2017

(65) Prior Publication Data

US 2018/0166849 A1    Jun. 14, 2018

(30) Foreign Application Priority Data

Dec. 13, 2016   (JP) ................. 2016-240975

(51) Int. Cl.
| | |
|---|---|
| H01S 5/20 | (2006.01) |
| G02B 3/00 | (2006.01) |
| H01S 5/40 | (2006.01) |
| H04N 5/74 | (2006.01) |
| G02B 27/18 | (2006.01) |
| G03B 21/00 | (2006.01) |
| G03B 21/14 | (2006.01) |
| G03B 21/20 | (2006.01) |
| H01S 5/022 | (2006.01) |
| H01S 5/024 | (2006.01) |

(Continued)

(52) U.S. Cl.
CPC ............ H01S 5/024 (2013.01); G02B 3/0062 (2013.01); G02B 27/18 (2013.01); G03B 21/00 (2013.01); G03B 21/14 (2013.01); G03B 21/20 (2013.01); H01S 5/02252 (2013.01); H01S 5/183 (2013.01); H01S 5/2031 (2013.01); H01S 5/4093 (2013.01); H04N 5/74 (2013.01); *G02B 3/0056* (2013.01); *G02B 27/1066* (2013.01); *G02B 27/141* (2013.01); *G02B 27/149* (2013.01); *G02B 27/286* (2013.01)

(58) Field of Classification Search
CPC ...... H01S 5/024; H01S 5/02252; H01S 5/183; H01S 5/2031; H01S 5/4093; G02B 27/18
USPC .......................................................... 353/38
See application file for complete search history.

(56) References Cited

U.S. PATENT DOCUMENTS

| | | | | |
|---|---|---|---|---|
| 5,957,560 A | * | 9/1999 | Do | G02B 27/283 |
| | | | | 348/760 |
| 2012/0242961 A1 | * | 9/2012 | Miura | G02B 27/0961 |
| | | | | 353/38 |

(Continued)

FOREIGN PATENT DOCUMENTS

JP     2014-138148 A    7/2014

*Primary Examiner* — Steven Whitesell Gordon
*Assistant Examiner* — Jerry L Brooks
(74) *Attorney, Agent, or Firm* — Oliff PLC

(57) ABSTRACT

An illumination device includes: a plurality of light-emitting elements; a collimating optical system; a first multi-lens array including a plurality of first lenses; a second multi-lens array including a plurality of second lenses; and a superimposing lens. The plurality of second lenses are arranged respectively corresponding to the plurality of first lenses. The plurality of first lenses form a plurality of first lens columns. A width, in a first direction, of one second lens of the plurality of second lenses has a distribution in a second direction, where the first direction is a direction in which the plurality of first lens columns are arranged and the second direction is a direction orthogonal to the first direction.

8 Claims, 11 Drawing Sheets

(51) Int. Cl.
*H01S 5/183* (2006.01)
*G02B 27/10* (2006.01)
*G02B 27/14* (2006.01)
*G02B 27/28* (2006.01)

(56) References Cited

U.S. PATENT DOCUMENTS

2013/0235353 A1\* 9/2013 Kaneda .................... F21V 5/04
353/31
2014/0226132 A1\* 8/2014 Kawasumi ......... G03B 21/2073
353/20

\* cited by examiner

ILLUMINATION DEVICE AND PROJECTOR

BACKGROUND

1. Technical Field

The present invention relates to an illumination device and a projector.

2. Related Art

In recent years, an illumination device using a light-emitting element, such as a semiconductor laser from which high-luminance, high-output light is obtained, has attracted attention as an illumination device used for a projector. In the illumination device, a predetermined region of a phosphor layer is uniformly illuminated by light from a plurality of light-emitting elements with the use of a pair of multi-lens arrays (e.g., see JP-A-2014-138148).

For emitting laser light onto the predetermined region of the phosphor layer, each of a plurality of beams emitted from the multi-lens array in the front stage has to be incident on the corresponding lens of the multi-lens array in the rear stage. However, some deviation (mounting error) unavoidably occurs in the alignment of an optical system or light-emitting element that is located in the front stage of the front-stage multi-lens array. The "mounting error" herein includes a deviation in alignment due to tolerances of an optical system such as the front-stage multi-lens array or the light-emitting element.

If such a mounting error is present, the beam emitted from the front-stage multi-lens array cannot be incident on the corresponding lens of the rear-stage multi-lens array. The beam is emitted onto a region other than the predetermined region, resulting in the problem of a reduction in light-use efficiency.

SUMMARY

An advantage of some aspects of the invention is to provide an illumination device that is less affected by a mounting error. Another advantage of some aspects of the invention is to provide a projector including the illumination device.

A first aspect of the invention provides an illumination device including: a plurality of light-emitting elements; a collimating optical system on which light emitted from the plurality of light-emitting elements is incident; a first multi-lens array on which light emitted from the collimating optical system is incident and which includes a plurality of first lenses; a second multi-lens array on which light emitted from the first multi-lens array is incident and which includes a plurality of second lenses; and a superimposing lens on which light emitted from the second multi-lens array is incident, wherein the plurality of second lenses are arranged respectively corresponding to the plurality of first lenses, the plurality of first lenses form a plurality of first lens columns, a width, in a first direction, of one second lens of the plurality of second lenses has a distribution in a second direction, where the first direction is a direction in which the plurality of first lens columns are arranged and the second direction is a direction orthogonal to the first direction, and a maximum value of the width of the one second lens is larger than a width, in the first direction, of one first lens of the plurality of first lenses that corresponds to the one second lens.

In the illumination device according to the first aspect, the maximum value of the width of the second lens in the first direction is larger than the width of the first lens in the first direction. With this configuration, even when, for example, a secondary light source image of the light emitted from the light-emitting element deviates in the first direction on the second lens because of the mounting error of the light-emitting element, the secondary light source image is less likely to protrude from the second lens. Hence, since the light emitted from the light-emitting element is efficiently incident on a predetermined region to be illuminated, high light-use efficiency can be obtained.

In the first aspect, it is preferable that a secondary light source image formed on the one second lens has a longitudinal direction, and that the longitudinal direction is parallel to the first direction.

When the secondary light source image deviates in the longitudinal direction, the secondary light source image is likely to protrude from the second lens. However, according to the configuration, even if the secondary light source image deviates in the longitudinal direction, the secondary light source image is less likely to protrude from the second lens.

In the first aspect, it is preferable that each of the plurality of second lenses has a hexagonal planar shape.

According to this configuration, the second lenses are closely packed.

In the first aspect, it is preferable that the illumination device further includes a wavelength conversion element on which light emitted from the superimposing lens is incident.

According to this configuration, illumination light including light generated by the wavelength conversion element can be generated.

A second aspect of the invention provides a projector including: the illumination device according to the first aspect; a wavelength conversion element on which light emitted from the illumination device is incident; a light modulator that modulates light emitted from the wavelength conversion element in response to image information to form image light; and a projection optical system that projects the image light.

According to the projector according to the second aspect, since the illumination device is included, light-use efficiency is high.

A third aspect of the invention provides a projector including: the illumination device according to the first aspect; a light modulator that modulates light emitted from the illumination device in response to image information to thereby form image light; and a projection optical system that projects the image light.

According to the projector according to the third aspect, since the illumination device is included, light-use efficiency is high.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
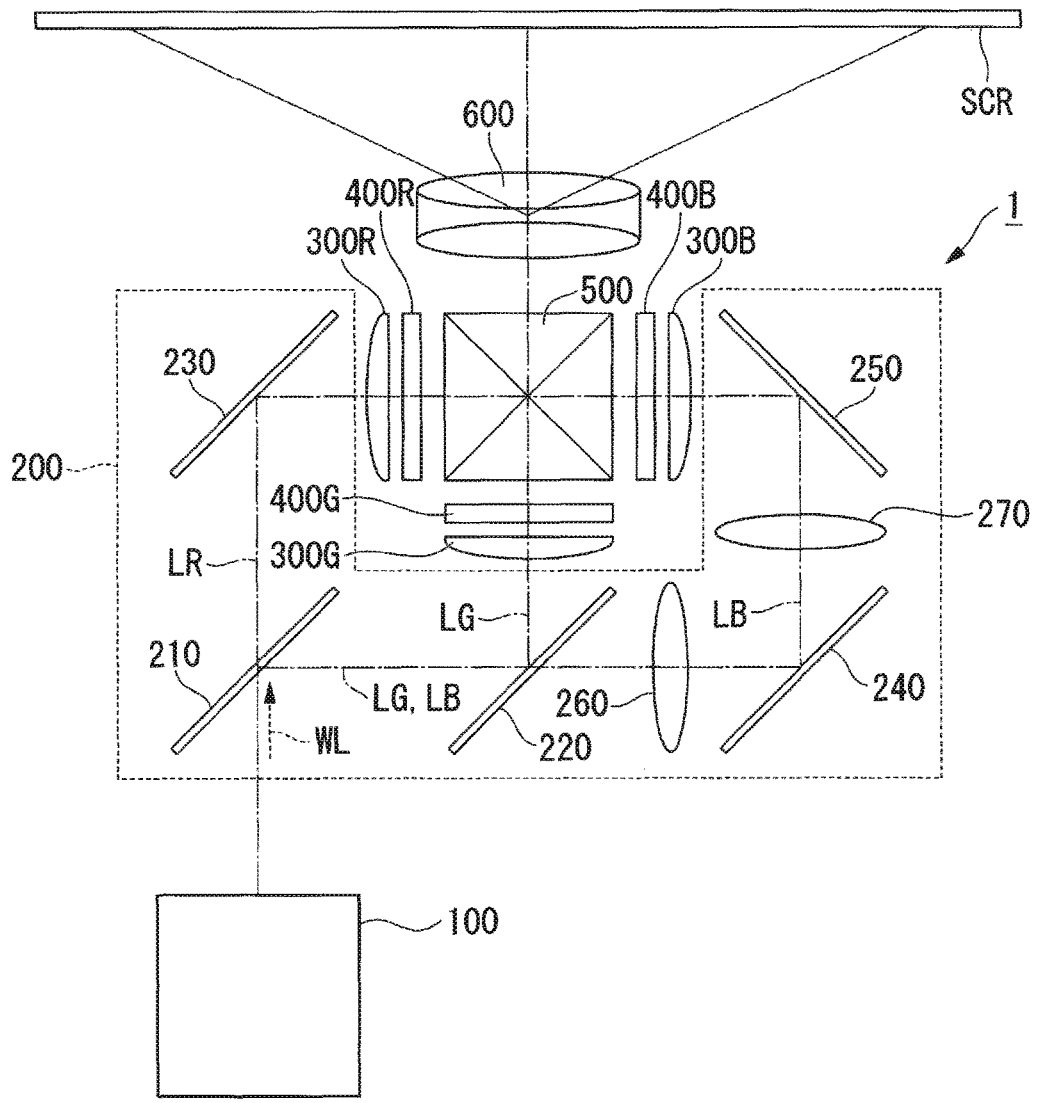
FIG. 1 is a diagram showing a schematic configuration of a projector of a first embodiment.

Hereinafter, embodiments of the invention will be described in detail with reference to the drawings. In the drawings used in the following description, a feature portion may be shown in an enlarged manner for the sake of convenience and clarity of the feature, and thus the dimension ratio and the like of each component are not always the same as actual ones.

First Embodiment

First, a projector according to a first embodiment will be described. FIG. 1 is a diagram showing a schematic configuration of the projector 1 of the embodiment.

As shown in FIG. 1, the projector 1 includes an illumination device 100, a color separation/light guiding system 200, light modulators 400R, 400G, and 400B, a cross dichroic prism 500, and a projection optical system 600.

In the embodiment, the illumination device 100 emits white light WL including red light (R), green light (G), and blue light (B).

The color separation/light guiding system 200 includes dichroic mirrors 210 and 220, reflection mirrors 230, 240, and 250, and relay lenses 260 and 270. The color separation/light guiding system 200 separates the white light WL from the illumination device 100 into red light LR, green light LG, and blue light LB, and directs the red light LR, the green light LG, and the blue light LB to the light modulators 400R, 400G, and 400B respectively corresponding thereto.

Field lenses 300R, 300G, and 300B are disposed between the color separation/light guiding system 200 and the light modulators 400R, 400G, and 400B.

The dichroic mirror 210 is a dichroic mirror that transmits a red light component and reflects a green light component and a blue light component. The dichroic mirror 220 is a dichroic mirror that reflects the green light component and transmits the blue light component. The reflection mirror 230 is a reflection mirror that reflects the red light component. The reflection mirrors 240 and 250 are reflection mirrors that reflect the blue light component.

Each of the light modulators 400R, 400G, and 400B includes a liquid crystal panel that modulates incident color light in response to image information to form image light. The operating mode of the liquid crystal panel may be the TN mode, the VA mode, the transverse electric-field mode, or the like, and is not particularly limited.

Although not shown in the drawing, a light incident-side polarizer is disposed between each of the field lenses 300R, 300G, and 300B and each of the light modulators 400R, 400G, and 400B while a light exiting-side polarizer is disposed between each of the light modulators 400R, 400G, and 400B and the cross dichroic prism 500.

The cross dichroic prism 500 combines the image lights emitted from the light modulators 400R, 400G, and 400B to form a color image.

The cross dichroic prism 500 has a substantially square shape, in a plan view, formed of four right-angle prisms bonded together, and dielectric multilayer films are formed at interfaces having a substantially X-shape between the right-angle prisms bonded together.

The color image emitted from the cross dichroic prism 500 is enlarged and projected by the projection optical system 600, and the image is formed on a screen SCR.

Illumination Device

Figure 2:
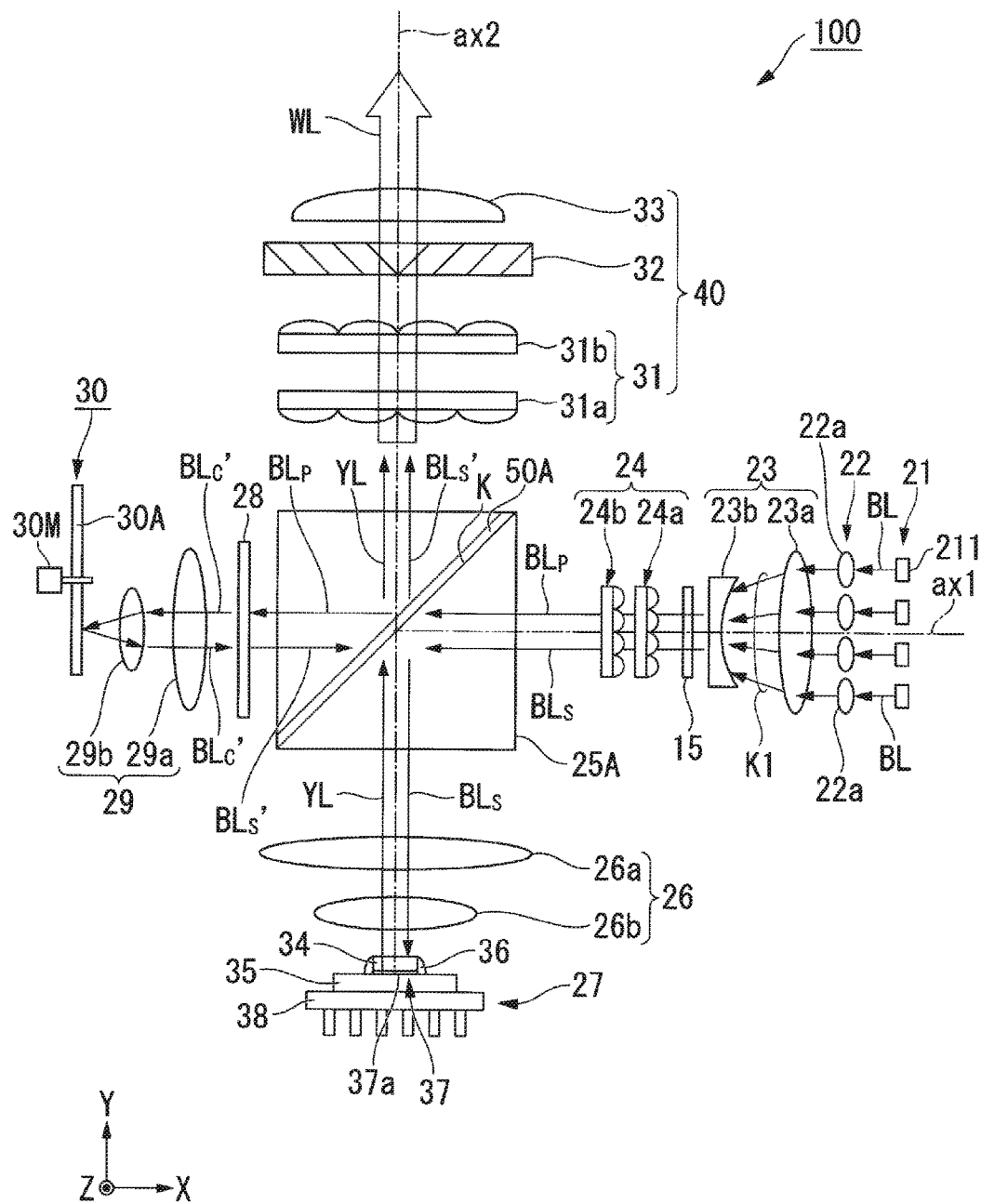
FIG. 2 is a plan view showing a schematic configuration of an illumination device.

FIG. 2 is a plan view showing a schematic configuration of the illumination device 100. Each configuration of the illumination device 100 will be described using the X-Y-Z coordinate system in the drawings shown below. In FIG. 2, the X-direction is a direction parallel to an optical axis ax1; the Y-direction is a direction parallel to an optical axis ax2 orthogonal to the optical axis ax1; and the Z-direction is a direction orthogonal to the X-direction and the Y-direction.

As shown in FIG. 2, the illumination device 100 includes an array light source 21 including a plurality of semiconductor lasers 211, a collimator optical system 22, an afocal optical system 23, a first retardation film 15, a homogenizer optical system 24, an optical element 25A including a polarization separation element 50A, a first condensing optical system 26, a fluorescent light-emitting element 27, a second retardation film 28, a second condensing optical system 29, a diffuse reflection element 30, and a uniform illumination system 40.

In the embodiment, the plurality of semiconductor lasers 211 correspond to "plurality of light-emitting elements" in the appended claims.

In these components, the array light source 21, the collimator optical system 22, the afocal optical system 23, the first retardation film 15, the homogenizer optical system 24, the optical element 25A, the second retardation film 28, the second condensing optical system 29, and the diffuse reflection element 30 are sequentially arranged on the optical axis ax1.

On the other hand, the fluorescent light-emitting element 27, the first condensing optical system 26, and the optical element 25A are sequentially arranged on the optical axis ax2. The optical axis ax1 and the optical axis ax2 are in a positional relationship in which the optical axis ax1 and the optical axis ax2 lie in the same plane and are orthogonal to each other.

The array light source 21 includes the plurality of semiconductor lasers 211. The plurality of semiconductor lasers 211 are arranged in an array in the same plane orthogonal to the optical axis ax1. The semiconductor laser 211 emits, for example, a beam BL composed of blue laser light having a peak wavelength of 460 nm.

Based on the configuration described above, the array light source 21 emits a bundle of beams K1 composed of a plurality of beams BL.

Figure 3:
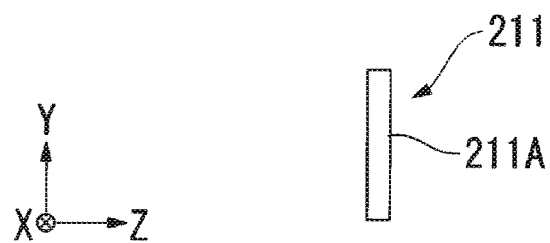
FIG. 3 is a diagram of a light emission region of a semiconductor laser as viewed in a plan view.

FIG. 3 is a diagram of a light emission region of the semiconductor laser 211 as viewed in a plan view. As shown in FIG. 3, the light emission region 211A of the semiconductor laser 211 has, for example, a substantially rectangular planar shape having a longitudinal direction and a transverse direction. The longitudinal direction of the light emission region 211A corresponds to a direction along the optical axis ax2 (the Y-direction) shown in FIG. 2. The transverse direction of the light emission region 211A corresponds to a direction along the Z-direction.

Returning to FIG. 2, the bundle of beams K1 emitted from the array light source 21 is incident on the collimator optical system 22. The collimator optical system 22 converts the beams BL emitted from the array light source 21 to a parallel light bundle. The collimator optical system 22 is configured of, for example, a plurality of collimator lenses 22a arranged in an array. The plurality of collimator lenses 22a are disposed respectively corresponding to the plurality of semiconductor lasers 211.

The bundle of beams K1 passing through the collimator optical system. 22 is incident on the afocal optical system 23. The afocal optical system. 23 adjusts the light bundle diameter of the bundle of beams K1. The afocal optical system 23 is configured of, for example, a convex lens 23a and a concave lens 23b.

The bundle of beams K1 passing through the afocal optical system 23 is incident on the first retardation film 15. The first retardation film 15 is, for example, a ½ wave plate that is rotatable. The beam BL emitted from the semiconductor laser 211 is linearly polarized light. By properly setting the rotation angle of the ½ wave plate, the beam BL passing through the first retardation film 15 can be converted into light (the bundle of beams K1) including a beam BLs of an S-polarization component and a beam BLp of a P-polarization component with respect to the polarization separation element 50A at a predetermined ratio.

The bundle of beams K1 including the beam BLs and the beam BLp is incident on the homogenizer optical system 24. The homogenizer optical system 24 makes an illuminance distribution by the beam BLs uniform on a phosphor layer 34 in cooperation with the first condensing optical system 26. Moreover, the homogenizer optical system 24 makes an illuminance distribution by a beam BLc', to be described later, uniform on a diffuse reflector 30A in cooperation with the second condensing optical system 29. In the embodiment, the phosphor layer 34 corresponds to "wavelength conversion element" in the appended claims.

The homogenizer optical system 24 is configured of, for example, a first multi-lens array 24a and a second multi-lens array 24b. The first multi-lens array 24a includes a plurality of first lenses 24am. The second multi-lens array 24b includes a plurality of second lenses 24bm. The plurality of second lenses 24bm correspond respectively to the plurality of first lenses 24am.

The fluorescent light-emitting element 27 and the diffuse reflection element 30 are disposed respectively at positions optically conjugate with the first multi-lens array 24a (the first lens 24am). The light emission region 211A of the semiconductor laser 211 is disposed at a position optically conjugate with the second multi-lens array 24b.

Some deviation unavoidably occurs in the alignment of the semiconductor laser 211 or the collimator lens 22a corresponding to the semiconductor laser 211. That is, the illumination device 100 has some mounting error in the embodiment. The "mounting error" herein includes a deviation in alignment due to tolerances of an optical system such as the front-stage multi-lens array or a light-emitting element.

Here, with reference to a comparative example, a main part configuration of the illumination device 100 of the embodiment and the advantageous effects thereof will be described.

Figure 4:
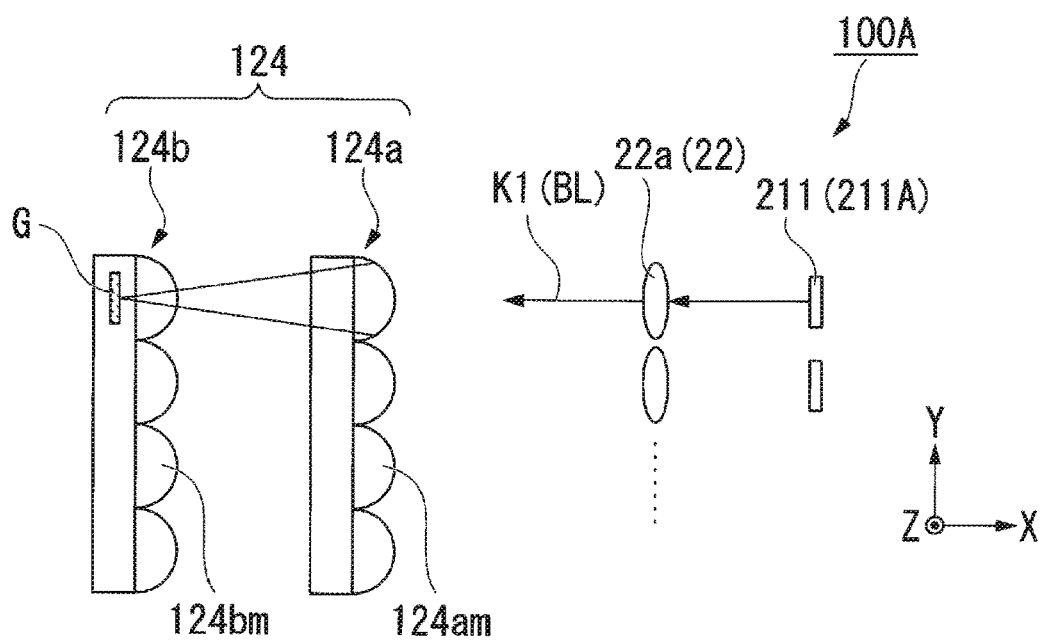
FIG. 4 is a diagram showing a main part configuration of an illumination device according to a comparative example.

FIG. 4 is a diagram showing a main part configuration of an illumination device 100A according to the comparative example. The illumination device 100A in FIG. 4 has the same configuration as the illumination device 100 of the embodiment, except that the homogenizer optical system 24 is replaced with a homogenizer optical system 124. In FIG. 4, only the homogenizer optical system 124, the array light source 21, and the collimator lenses 22a are shown.

The homogenizer optical system 124 includes a first multi-lens array 124a including a plurality of first lenses 124am, and a second multi-lens array 124b including a plurality of second lenses 124bm.

For example, when the mounting error described above occurs in the semiconductor laser 211, the uniformity of the illuminance distribution by the beam BLs on the phosphor layer 34 is reduced. This is because the position of a secondary light source image G formed on the second lens 124bm by the beam BL emitted from the light emission region 211A deviates from a predetermined position in the second lens 124bm as will be described later.

When the planar shape of the light emission region 211A is the shape (e.g., an oblong) having a longitudinal direction in the Y-direction as described above, the planar shape of the secondary light source image G formed on the second lens 124bm having the optically conjugate relationship with the light emission region 211A is a shape (an oblong) having a longitudinal direction in the Y-direction.

Here, the movement of the secondary light source image on the second lens 124bm due to the mounting error may occur in any direction.

Figure 5A:
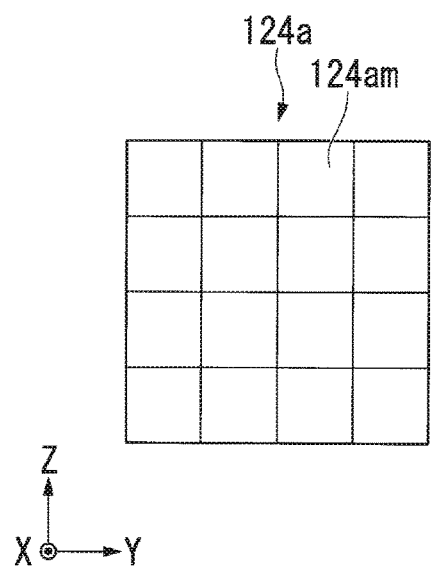
FIG. 5A is a plan view of a first multi-lens array according to the comparative example as viewed in the +X-direction.
Figure 5B:
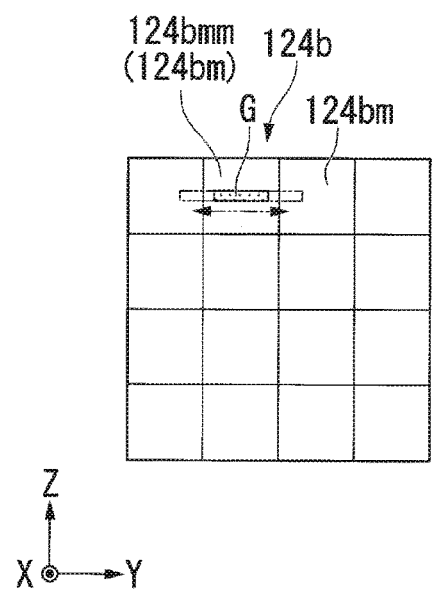
FIG. 5B is a plan view of a second multi-lens array according to the comparative example as viewed in the +X-direction.

FIG. 5A is a plan view of the first multi-lens array 124a as viewed in the +X-direction. FIG. 5B is a plan view of the second multi-lens array 124b as viewed in the +X-direction.

As shown in FIGS. 5A and 5B, the size of the first lens 124am is the same as the size of the second lens 124bm in the homogenizer optical system 124. Specifically, the planar shape of the first lens 124am and the planar shape of the second lens 124bm are both a square whose one side is parallel to the Y-direction.

When the mounting error occurs, the secondary light source image G deviates from the predetermined position. In FIG. 5B, the second lens 124bm on which the secondary light source image G is to be formed is referred to as a "second lens 124bmm". As can be seen from FIG. 5B, the secondary light source image G is more likely to protrude from the second lens 124bmm in the case where the secondary light source image G deviates in the longitudinal direction (the Y-direction) of the light emission region 211A than in the case where the secondary light source image G deviates in the Z-direction. Since light from a portion of the secondary light source image G that protrudes from the second lens 124bmm is not incident on a predetermined region to be illuminated, light-use efficiency is reduced.

In contrast, the illumination device 100 of the embodiment includes the homogenizer optical system 24 including the first multi-lens array 24a and the second multi-lens array 24b having features in arrangement and shape.

Hereinafter, the configuration of the homogenizer optical system 24 will be described in detail.

Figure 6A:
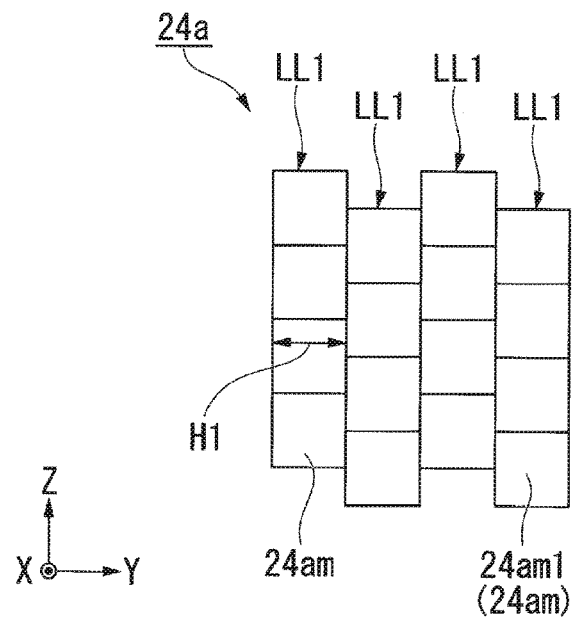
FIG. 6A is a plan view of a first multi-lens array according to the first embodiment as viewed in the +X-direction.
Figure 6B:
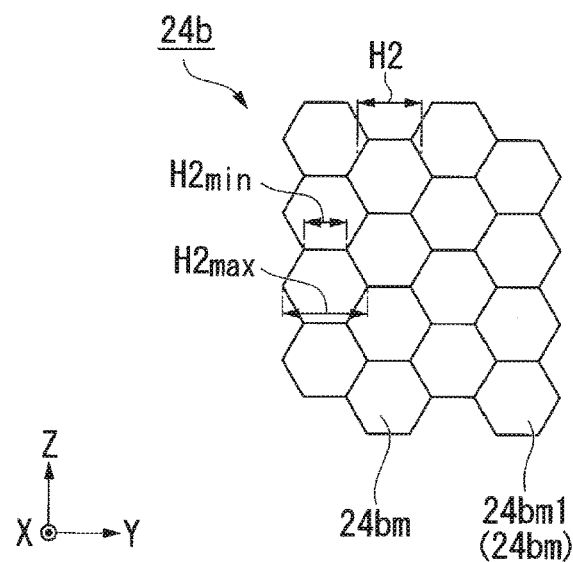
FIG. 6B is a plan view of a second multi-lens array according to the first embodiment as viewed in the +X-direction.

FIG. 6A is a plan view of the first multi-lens array 24a as viewed in the +X-direction. FIG. 6B is a plan view of the second multi-lens array 24b as viewed in the +X-direction.

As shown in FIGS. 6A and 6B, the first multi-lens array 24a includes the plurality of first lenses 24am; the second multi-lens array 24b includes the plurality of second lenses 24bm; and the plurality of second lenses 24bm correspond respectively to the plurality of first lenses 24am.

In the embodiment, the planar shape of the second lens 24bm is different from the planar shape (a substantially square shape) of the first lens 24am.

As shown in FIG. 6A, the plurality of first lenses 24am are disposed so as to form a plurality of first lens columns LL1 in the first multi-lens array 24a. In the embodiment, the first multi-lens array 24a includes four first lens columns LL1. The four first lens columns LL1 are arranged along the Y-direction. Each of the first lens columns LL1 includes four first lenses 24am. In the first multi-lens array 24a, the positions of the first lens columns LL1 adjacent to each other are different from each other in the Z-direction.

With this configuration, the first multi-lens array 24a has a structure in which a total of 16 first lenses 24am are disposed in a staggered manner. In the embodiment, the planar shape of the plurality of first lenses 24am is a square whose one side is parallel to the Y-direction. The number of the first lenses 24am that constitute each of the first lens columns LL1 and the number of columns of the first lens column LL1 are not limited to those of the configuration described above.

Here, the Y-direction in which the plurality of first lens columns LL1 are arranged is referred to as a "first direction", and the Z-direction orthogonal to the first direction is referred to as a "second direction".

As shown in FIG. 6B, the second multi-lens array 24b has a structure in which a total of 16 second lenses 24bm are disposed in a staggered manner similarly to the first multi-lens array 24a. In the embodiment, in the planar shape of the second lens 24bm, a width H2 in the first direction (the Y-direction) has a distribution in the second direction (the Z-direction). A width H1 of a first lens 24am1 in the first direction (the Y-direction) is constant. Hereinafter, if not otherwise specified, the width means a width in the first direction.

Here, the maximum value of the width H2 of the second lens 24bm is defined as a maximum width $H2_{max}$, while the minimum value is defined as a minimum width $H2_{min}$.

Specifically in the embodiment, the planar shape of the plurality of second lenses 24bm is a hexagon. By making the planar shape of the second lens 24bm hexagonal in the second multi-lens array 24b as described above, the second lenses 24bm are closely packed.

Hereinafter, one second lens of the plurality of second lenses 24bm is defined as a second lens 24bm1. One first lens of the plurality of first lenses 24am that corresponds to the second lens 24bm1 is defined as the first lens 24am1.

The first lens 24am1 corresponds to "one first lens of the plurality of first lenses that corresponds to the one second lens" in the appended claims. The second lens 24bm1 corresponds to "one second lens of the plurality of second lenses" in the appended claims.

Figure 7:
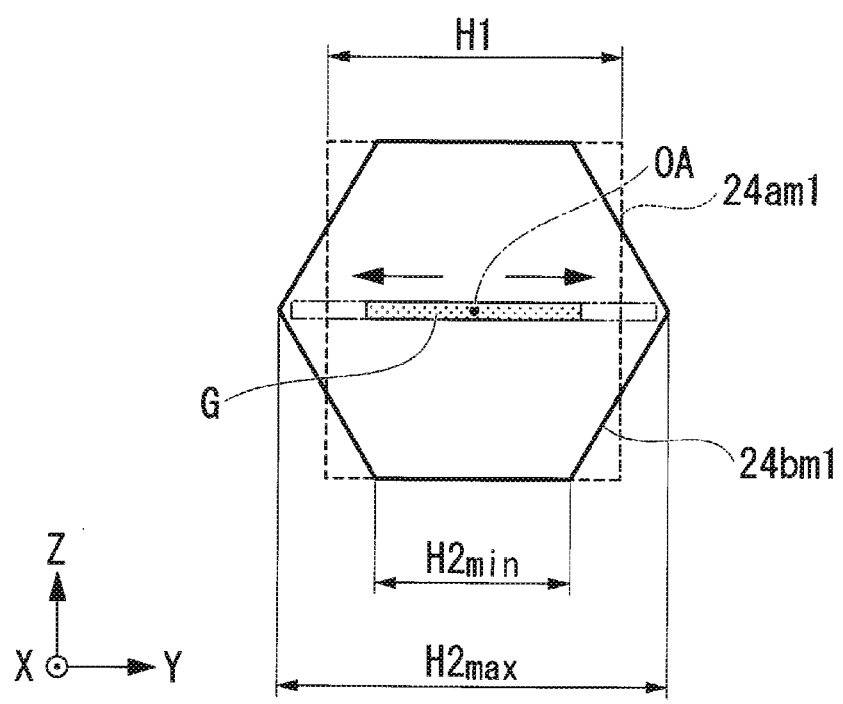
FIG. 7 is a diagram of first and second lenses as viewed in a direction parallel to an optical axis.

FIG. 7 is a diagram of the first lens 24am1 and the second lens 24bm1 as viewed in a direction parallel to the optical axis ax1. In FIG. 7, the first lens 24am1 is shown by the broken line. The optical axis of the first lens 24am1 is coincident with an optical axis OA of the second lens 24bm1.

As shown in FIG. 7, the maximum width $H2_{max}$ of the second lens 24bm1 is larger than the width H1 of the first lens 24am1. In the second lens 24bm1, the maximum width $H2_{max}$ is located in the central portion in the second direction (the Z-direction). The width H1 equals $(H2_{max}+H2_{min})/2$.

The homogenizer optical system 24 is designed such that if there is no mounting error, the secondary light source image G is formed centered around the optical axis of the second lens 24bm1.

In the embodiment, the longitudinal direction (the Y-direction) of the light emission region 211A is coincident with the first direction (the Y-direction) in which the second lens 24bm1 has the maximum width $H2_{max}$. That is, the longitudinal direction of the secondary light source image G formed on the second lens 24bm1 substantially coincides with the first direction.

In the embodiment, the maximum width $H2_{max}$ of the second lens 24bm1 is larger than the width H1 of the first lens 24am1. Hence, even if the secondary light source image G deviates in the Y-direction in which a protrusion is likely to occur in the related art, the secondary light source image G is less likely to protrude from the second lens 24bm1 as shown in FIG. 7.

Moreover, in the embodiment, the plurality of second lenses 24bm are closely packed because the planar shape of the second lens 24bm is a hexagon.

According to the homogenizer optical system 24 of the embodiment as described above, the secondary light source image G is less likely to protrude from the second lens 24bm. Hence, the light from the array light source 21 can be efficiently used. Moreover, since the mounting accuracy is not required to be as high as before, the manufacture of the illumination device 100 is facilitated and thus cost reduction can be achieved.

As described above, the lights emitted from the second lenses 24bm are parallel to each other, and therefore favorably condensed onto the fluorescent light-emitting element 27 or the diffuse reflection element 30 via the first condensing optical system 26 or the second condensing optical system 29 to be described later.

The optical element 25A is configured of, for example, a dichroic prism having wavelength selectivity. The dichroic prism includes an inclined surface K forming an angle of 45° with respect to the optical axis ax1. The inclined surface K also forms an angle of 45° with respect to the optical axis ax2.

The optical element 25A is disposed at the point of intersection of the optical axes ax1 and ax2 orthogonal to each other. The optical element 25A is not limited to a prism-shaped one such as a dichroic prism, but a parallel flat plate-like dichroic mirror may be used.

The polarization separation element 50A having wavelength selectivity is provided on the inclined surface K. The polarization separation element 50A has a polarization separation function to separate the bundle of beams K1 passing through the first retardation film 15 into an S-polarization component and a P-polarization component with respect to the polarization separation element 50A. Specifically, the polarization separation element 50A reflects the beam BLs of the S-polarization component of the incident light (the bundle of beams K1) while transmitting the beam BLp of the P-polarization component of the incident light.

The beam BLs as the S-polarization component is reflected by the polarization separation element 50A and directed to the fluorescent light-emitting element 27. The beam BLp as the P-polarization component passes through the polarization separation element 50A and is directed to the diffuse reflection element 30.

Moreover, the polarization separation element 50A has a color separation function to transmit fluorescent light YL, which is different in wavelength band from the bundle of beams K1 and will be described later, irrespective of the polarization state of the fluorescent light YL.

The S-polarized beam BLs emitted from the polarization separation element 50A is incident on the first condensing optical system 26. The first condensing optical system 26 condenses the beam BLs onto the phosphor layer 34 of the fluorescent light-emitting element 27. The first condensing optical system 26 is configured of, for example, pickup lenses 26a and 26b.

The beam BLs emitted from the first condensing optical system 26 is incident on the fluorescent light-emitting element 27. The fluorescent light-emitting element 27 includes the phosphor layer 34, a substrate 35 supporting the phosphor layer 34, and a fixing member 36 fixing the phosphor layer 34 to the substrate 35.

In the fluorescent light-emitting element 27, the phosphor layer 34 is fixed and supported to the substrate 35 by the fixing member 36 provided between the side surface of the phosphor layer 34 and the substrate 35 in a state where a surface of the phosphor layer 34 on the side opposite to the side on which the beam BLs is incident is in contact with the substrate 35.

The phosphor layer 34 contains phosphor particles that absorb the beam BLs, convert the beam BLs into the yellow fluorescent light YL, and emits the yellow fluorescent light YL. For example, yttrium-aluminum-garnet (YAG) based phosphor can be used as the phosphor particles. The forming material of phosphor particles may be of one kind, or a mixture of two or more kinds of particles different in forming material from each other may be used as the phosphor particles.

For the phosphor layer 34, a material having excellent heat resistance and surface workability is preferably used. As the phosphor layer 34, a phosphor layer obtained by dispersing the phosphor particles in an inorganic binder such as alumina, or a phosphor layer obtained by sintering the phosphor particles without using a binder, can be suitably used.

A reflection portion 37 is provided on the side of the phosphor layer 34 opposite to the side on which the beam BLs is incident. The reflection portion 37 has the function of reflecting a partial fluorescent light YL of the fluorescent light YL generated by the phosphor layer 34. With this configuration, the fluorescent light YL can be extracted efficiently from the phosphor layer 34 to the first condensing optical system 26 side.

Specifically, the reflection portion 37 can be configured by providing a reflection film 37a on the surface of the phosphor layer 34 on the side opposite to the side on which the beam BLs is incident. In this case, a surface of the reflection film 37a that faces the phosphor layer 34 serves as a reflection surface. The reflection portion 37 may be configured such that the substrate 35 includes a base material having light reflection characteristics. In this case, the reflection film 37a is omitted, and a surface of the substrate 35 that faces the phosphor layer 34 can be a reflection surface.

An inorganic adhesive having light reflection characteristics is preferably used for the fixing member 36. In this case, light leaking from the side surface of the phosphor layer 34 can be reflected into the phosphor layer 34 by the inorganic adhesive having light reflection characteristics. With this configuration, light extraction efficiency for the fluorescent light YL generated by the phosphor layer 34 to the first condensing optical system 26 side can be further increased.

A heat sink 38 is disposed on a surface of the substrate 35 on the side opposite to the surface thereof supporting the phosphor layer 34. Since heat can be dissipated through the heat sink 38 in the fluorescent light-emitting element 27, thermal degradation of the phosphor layer 34 can be prevented.

The partial fluorescent light YL of the fluorescent light YL generated by the phosphor layer 34 is reflected by the reflection portion 37 and emitted toward the first condensing optical system 26. Moreover, another partial fluorescent light YL of the fluorescent light YL generated by the phosphor layer 34 is emitted toward the first condensing optical system 26 without involving the reflection portion 37.

The fluorescent light YL emitted from the phosphor layer 34 passes through the first condensing optical system 26 and the polarization separation element 50A.

On the other hand, the P-polarized beam BLp emitted from the polarization separation element 50A is incident on the second retardation film 28. The second retardation film 28 is configured of a ¼ wave plate (λ/4 plate) disposed on the optical path between the polarization separation element 50A and the diffuse reflection element 30. The beam BLp passes through the second retardation film 28 and is thus converted into circularly polarized beam BLc'. The beam BLc' passing through the second retardation film 28 is incident on the second condensing optical system 29.

The second condensing optical system 29 condenses the beam BLc' onto the diffuse reflection element 30. The second condensing optical system 29 is configured of, for example, a pickup lens 29a and a pickup lens 29b.

The diffuse reflection element 30 diffusively reflects the beam BLc' emitted from the second condensing optical system 29 toward the polarization separation element 50A. As the diffuse reflection element 30, a diffuse reflection element that reflects, in a Lambertian manner, the beam BLc' incident on the diffuse reflection element 30 is preferably used.

The diffuse reflection element 30 includes the diffuse reflector 30A and a driving source 30M such as a motor for rotating the diffuse reflector 30A. The axis of rotation of the driving source 30M is disposed substantially parallel to the optical axis ax1. With this configuration, the diffuse reflector 30A is configured to be rotatable in a plane crossing a main beam of the beam BLc' incident on the diffuse reflector 30A. The diffuse reflector 30A is formed in, for example, a circular shape as viewed in the direction of the axis of rotation.

The circularly polarized beam BLc' reflected by the diffuse reflector 30A and passing again through the second condensing optical system 29 passes again through the second retardation film 28 and is thus converted into an S-polarized beam BLs'.

The beam BLs' (blue light) is combined with the fluorescent light YL by the polarization separation element 50A, and thus the white light WL is obtained. The white light WL is incident on the uniform illumination system 40 shown in FIG. 2.

The uniform illumination system 40 includes an optical integration system 31, a polarization conversion element 32, and a superimposing optical system 33. The uniform illumination system 40 makes an intensity distribution of the white light WL uniform in a region to be illuminated. The white light WL emitted from the uniform illumination system 40 is incident on the color separation/light guiding system 200.

Specifically, the optical integration system 31 is configured of, for example, a lens array 31a and a lens array 31b. The lens arrays 31a and 31b each include a plurality of lenses arranged in an array.

The white light WL passing through the optical integration system 31 is incident on the polarization conversion element 32. The polarization conversion element 32 is configured of, for example, a polarization separation film and a retardation film, and converts the white light WL into linearly polarized light. The polarization conversion element 32 is not essential.

The white light WL passing through the polarization conversion element 32 is incident on the superimposing optical system 33. The superimposing optical system 33 is configured of, for example, a superimposing lens, and superimposes the white light WL emitted from the polarization conversion element 32 onto a region to be illuminated. In the embodiment, an illuminance distribution in the region to be illuminated is made uniform by the optical integration system 31 and the superimposing optical system 33.

According to the embodiment as described above, the light emitted from the array light source 21 is efficiently incident on a predetermined region to be illuminated in the fluorescent light-emitting element 27 and on a predetermined region to be illuminated in the diffuse reflection element 30, and therefore, light-use efficiency is high. Hence, bright illumination light can be obtained. Hence, in the projector 1 including the illumination device 100 of the embodiment, light-use efficiency is high.

First Modified Example

Subsequently, an illumination device according to a first modified example will be described. The illumination device of the modified example differs from the illumination device 100 of the first embodiment in the configuration of a homogenizer optical system, and configurations of the modified example other than that are common to the first embodiment. In the following, the configurations and members common to the first embodiment are denoted by the same reference numerals and signs, and the detailed description thereof is omitted.

Figure 8:
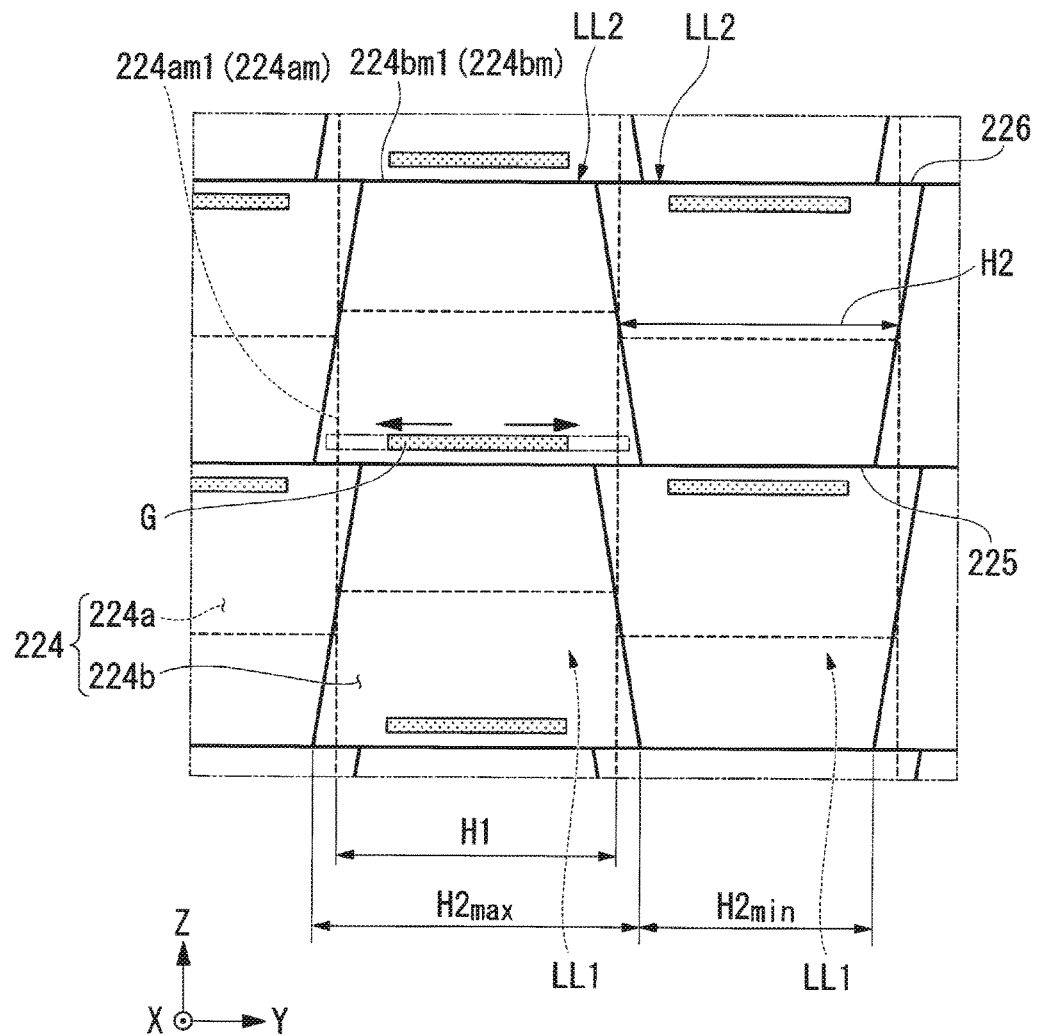
FIG. 8 is a diagram showing the configuration of a homogenizer optical system according to a first modified example.

A homogenizer optical system 224 according to the first modified example includes a first multi-lens array 224a including a plurality of first lenses 224am, and a second multi-lens array 224b including a plurality of second lenses 224bm. FIG. 8 is a diagram of the first multi-lens array 224a and the second multi-lens array 224b as viewed in a direction parallel to the optical axis ax1. However, a portion of the homogenizer optical system 224 is shown in FIG. 8. FIG. 8 corresponds to FIG. 7.

In the modified example, the configuration of the first multi-lens array 224a is different from the first multi-lens array 24a of the first embodiment. For example, the planar shape of the plurality of first lenses 224am is a square whose one side is parallel to the Y-direction, and the first lenses 224am are disposed in a substantially staggered manner.

The second multi-lens array 224b includes four second lens columns LL2. Each of the second lens columns LL2 corresponds to the first lens column LL1 of the first multi-lens array 224a. Each of the second lens columns LL2 includes four second lenses 224bm. Also in the modified example, in the planar shape of the second lens 224bm, the width H2 in the first direction (the Y-direction) has a distribution in the second direction (the Z-direction). The planar shape of the plurality of second lenses 224bm is a trapezoid having an upper base 225 and a lower base 226.

The second multi-lens array 224b is disposed in a state where the directions of the second lenses 224bm in the second lens columns LL2 adjacent to each other are inverted 180 degrees in the Z-direction. That is, two second lenses 224bm adjacent to each other in the first direction are disposed such that the upper base 225 of one of the second lenses 224bm and the lower base 226 of the other second lens 224bm are arranged on a straight line along the Y-direction. With this configuration, the second multi-lens array 224b has a structure in which the plurality of second lenses 224bm are closely disposed.

Hereinafter, one second lens of the plurality of second lenses 224bm is defined as a second lens 224bm1. One first lens of the plurality of first lenses 224am that corresponds to the one second lens 224bm1 is defined as a first lens 224am1. The first lens 224am1 corresponds to "one first lens of the plurality of first lenses that corresponds to the one second lens" in the appended claims. The second lens 224bm1 corresponds to "one second lens of the plurality of second lenses" in the appended claims.

As shown in FIG. 8, the maximum width $H2_{max}$ of the second lens 224bm is larger than the width H1 of the first lens 224am. In the second lens 224bm, the maximum width $H2_{max}$ is located at the lower base 226, while the minimum width $H2_{min}$ is located at the upper base 225.

The width H1 equals $(H2_{max}+H2_{min})/2$.

In the modified example, the homogenizer optical system 224 is designed such that if there is no mounting error, the secondary light source image G is formed in the vicinity of the upper base 225 of the second lens 224bm1 corresponding to the first lens 224am1 and in the central portion of the second lens 224bm1 in the first direction.

Also in the modified example, even if the secondary light source image G deviates in the Y-direction in which a protrusion is likely to occur in the related art, the secondary light source image G is less likely to protrude from the second lens 224bm1. Hence, the light from the array light source 21 can be efficiently used.

Second Modified Example

The case where the secondary light source image G formed on the second lens 24bm has a longitudinal direction in the Y-direction has been described in the first embodiment; however, the invention is not limited to this.

Figure 9:
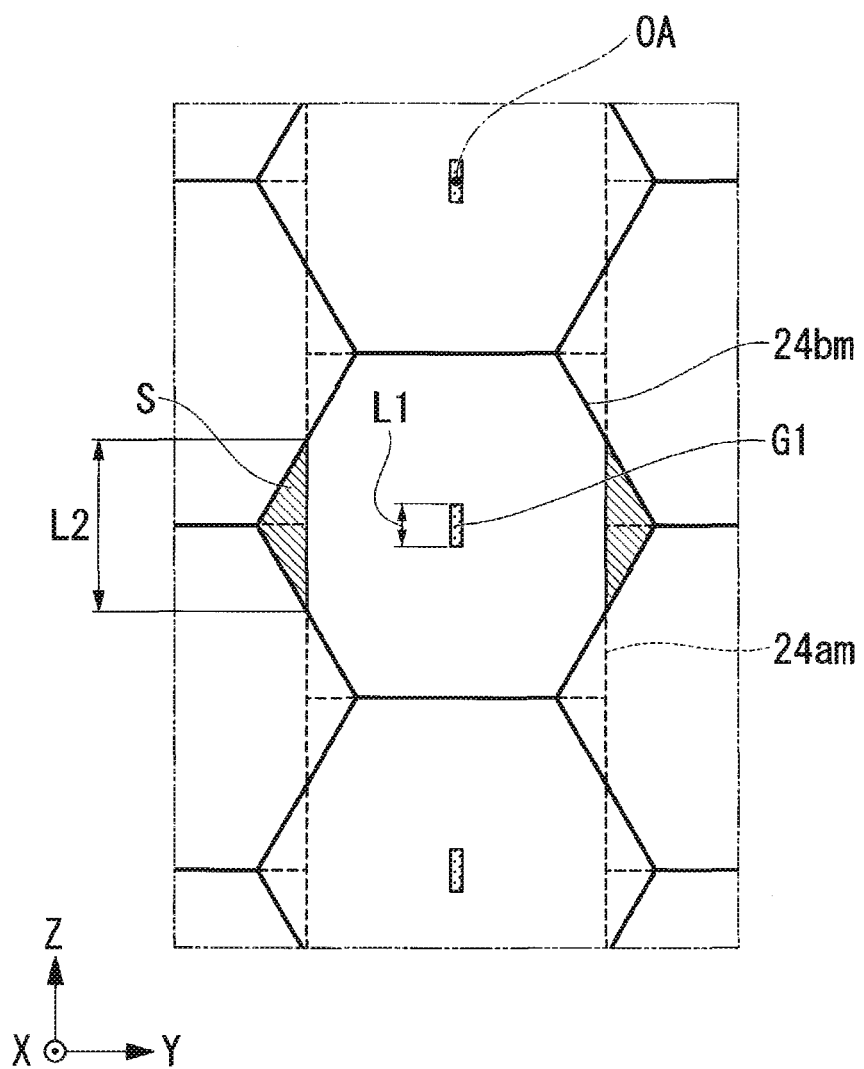
FIG. 9 is a diagram showing a secondary light source image formed on a second lens in a second modified example.

An illumination device according to a second modified example includes the homogenizer optical system 24 included in the illumination device 100 of the first embodiment. FIG. 9 is a diagram showing a secondary light source image G1 formed on the second lens 24bm. FIG. 9 corresponds to FIG. 7.

As shown in FIG. 9, in the modified example, the secondary light source image G1 formed on the second lens 24bm has a shape (an oblong shape) having a longitudinal direction in the Z-direction.

In FIG. 9, a region where the width of the second lens 24bm in the Y-direction is larger than the width of the first lens 24am in the Y-direction is indicated by Reference sign S. In the modified example, a length L1 of the secondary light source image G1 in the longitudinal direction (the Z-direction) is shorter than a length L2 of the region S in the Z-direction.

According to the modified example, even if the secondary light source image G1 deviates in the Y-direction, the secondary light source image G1 is less likely to protrude from the second lens 24bm compared to the related art, as shown in FIG. 9. Hence, the light from the array light source 21 can be efficiently used.

Second Embodiment

Subsequently, a projector according to a second embodiment will be described. Structures around a projection optical system of the projector according to the second embodiment are substantially similar to those of the projector according to the first embodiment, but the configuration of an illumination device is different therefrom. Hence, in the following description, differences from the first embodiment will be described in detail. Moreover, in the following, the configurations and members common to the first embodiment are denoted by the same reference numerals and signs, and the detailed description thereof is omitted.

Figure 10:
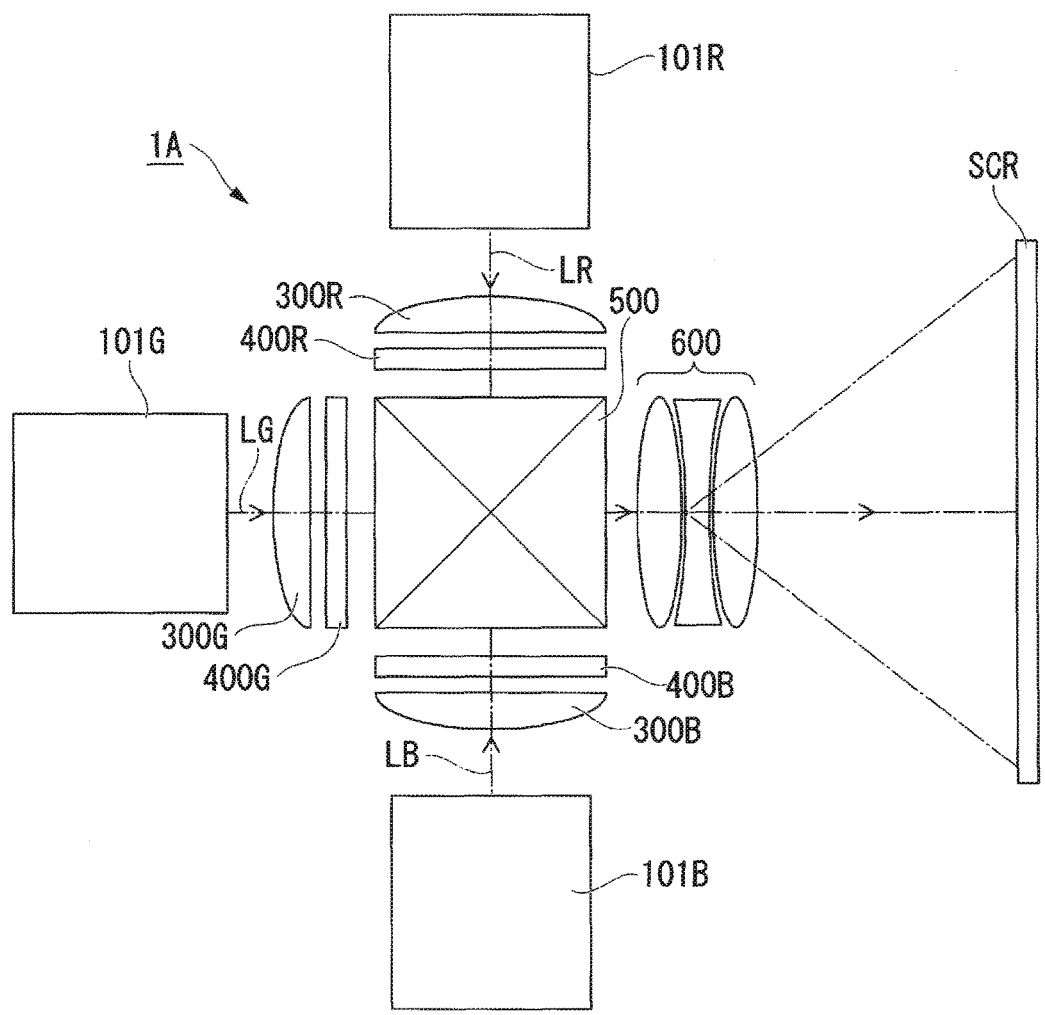
FIG. 10 is a schematic configuration diagram showing a projector of a second embodiment.

FIG. 10 is a schematic configuration diagram showing the projector of the embodiment.

As shown in FIG. 10, the projector 1A includes an illumination device 101R for red light, an illumination device 101G for green light, an illumination device 101B for blue light, the light modulators 400R, 400G, and 400B, the field lenses 300R, 300G, and 300B, the cross dichroic prism 500, and the projection optical system 600.

In the embodiment, each of the illumination device 101R for red light, the illumination device 101G for green light, and the illumination device 101B for blue light corresponds to "illumination device" in the appended claims.

The projector 1A roughly operates as follows.

The red light LR composed of red laser light emitted from the illumination device 101R for red light is incident on the light modulator 400R through the field lens 300R and thus modulated. Similarly, the green light LG composed of green laser light emitted from the illumination device 101G for green light is incident on the light modulator 400G through the field lens 300G and thus modulated. The blue light LB composed of blue laser light emitted from the illumination device 101B for blue light is incident on the light modulator 400B through the field lens 300B and thus modulated.

Hereinafter, each component of the projector 1A will be described.

The illumination device 101R for red light, the illumination device 101G for green light, and the illumination device 101B for blue light are different only in the color of light to be emitted, and have similar device configurations.

As one example, a laser light source for red light emits the red light LR composed of laser light having a peak wavelength in a wavelength range of approximately from 585 to 720 nm. A laser light source for green light emits the green light LG composed of laser light having a peak wavelength in a wavelength range of approximately from 495 to 585 nm. A laser light source for blue light emits the blue light LB composed of laser light having a peak wavelength in a wavelength range of approximately from 380 to 495 nm.

Hence, only the illumination device 101B for blue light will be described below, and the description of the illumination device 101R for red light and the illumination device 101G for green light is omitted.

Figure 11:
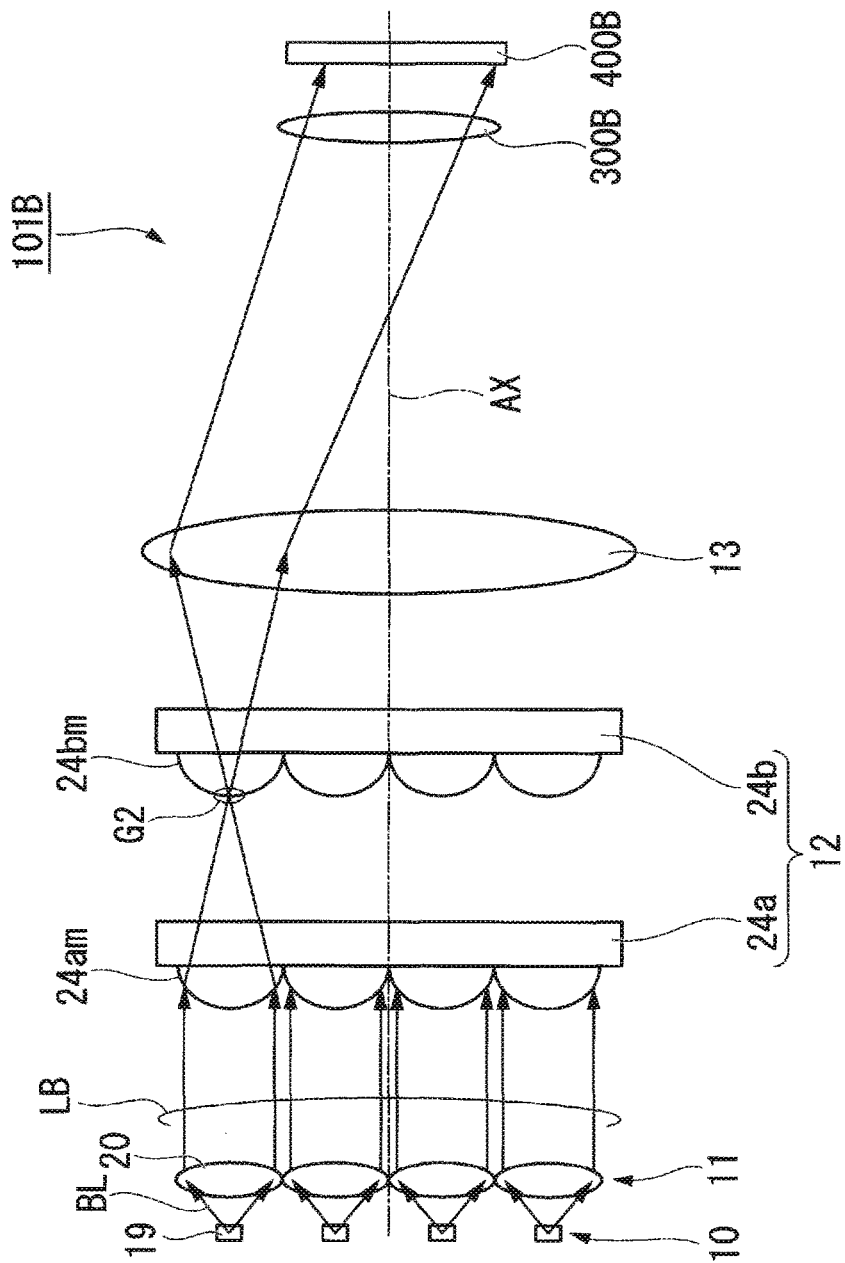
FIG. 11 is a diagram showing a schematic configuration of an illumination device for blue light.

FIG. 11 is a diagram showing a schematic configuration of the illumination device 101B for blue light. In FIG. 11, the field lens 300B and the light modulator 400B are also shown for convenience of description.

As shown in FIG. 11, the illumination device 101B for blue light includes an array light source 10, a collimator optical system 11, a homogenizer optical system 12, and a superimposing optical system 13.

In the array light source 10, a plurality of semiconductor lasers 19 each emitting the blue beam BL are two-dimensionally arranged.

Only four semiconductor lasers 19 are shown in FIG. 11; however, the plurality of semiconductor lasers 19 are arranged in a matrix (e.g., four rows and four columns) in a plane vertical to an illumination optical axis AX. The number of the semiconductor lasers 19 is not limited to this.

The array light source 10 emits the blue light LB composed of the plurality of beams BL. In the embodiment, the plurality of semiconductor lasers 19 correspond to "plurality of light-emitting elements" in the appended claims.

The collimator optical system 11 is provided on the light exiting-side of the array light source 10, and the blue light LB emitted from the array light source 10 is incident on the collimator optical system 11. The collimator optical system 11 includes a plurality of collimator lenses 11a arranged in an array. The plurality of collimator lenses 11a are disposed respectively corresponding to the plurality of semiconductor lasers 19. Based on the configuration described above, the collimator optical system 11 collimates the beams BL.

The homogenizer optical system 12 has the same configuration as the homogenizer optical system 24 of the first embodiment. That is, the homogenizer optical system 12 is configured of the first multi-lens array 24a and the second multi-lens array 24b. Hence, since a secondary light source image G2 is less likely to protrude from the second lens 24bm, the blue light LB can be efficiently used.

The superimposing optical system 13 is configured of, for example, a superimposing lens, and superimposes the blue light LB emitted from the array light source 10 onto a region to be illuminated. In the embodiment, an illuminance distribution in the region to be illuminated is made uniform by the homogenizer optical system 12 and the superimposing optical system 13.

According to the illumination device 101B for blue light of the embodiment, the blue light LB emitted from the array light source 10 is efficiently incident on the image forming region of the light modulator 400B, and therefore, high light-use efficiency can be realized. Similarly, as for the illumination device 101R for red light and the illumination device 101G for green light, the red light LR and the green light LG are efficiently incident respectively on the image forming region of the light modulator 400R and the image forming region of the light modulator 400G, and therefore, high light-use efficiency can be realized.

Hence, according to the projector 1A of the embodiment, since the illumination device 101R for red light, the illumination device 101G for green light, and the illumination device 101B for blue light are included, light-use efficiency is high and thus a bright color image can be projected.

The invention is not limited to the details of the embodiments, and can be appropriately modified within the scope not departing from the spirit of the invention.

For example, the second lens 24bm having a hexagonal shape and the second lens 224bm having a trapezoidal shape have been exemplified respectively in the embodiment and the modified example, the invention is not limited to them. It is sufficient that the width of the second lens in the first direction (the Y-direction) has a distribution in the second direction (the Z-direction), and that the maximum width of the second lens is larger than the width H1 of the first lens.

Figure 12:
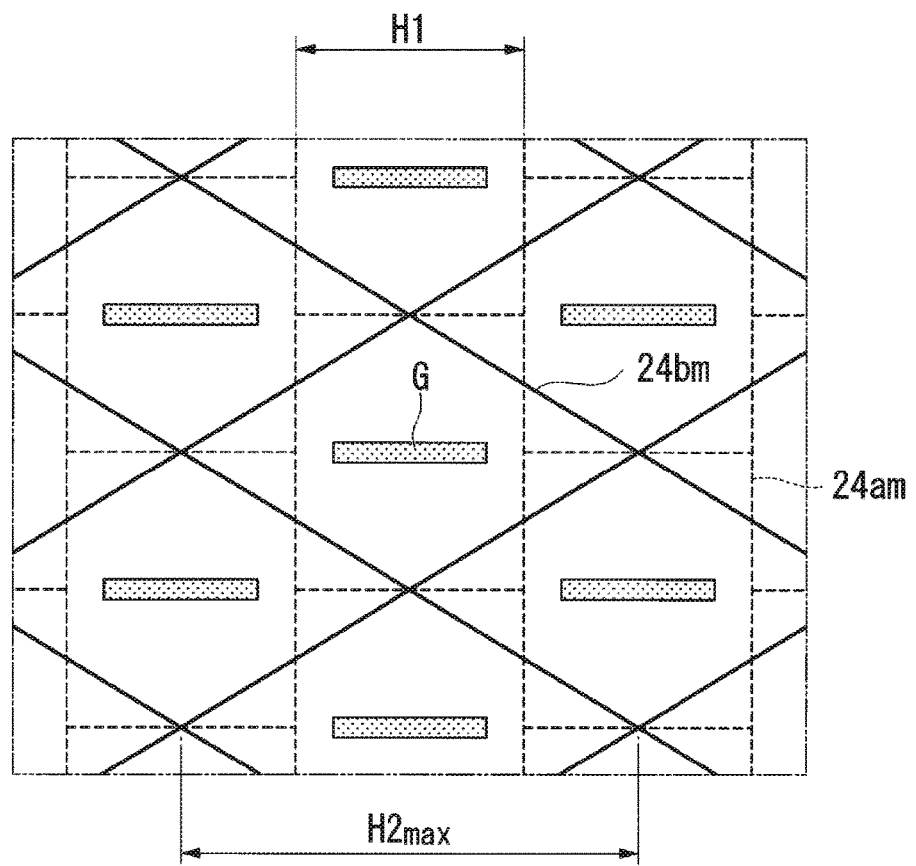
FIG. 12 is a diagram showing a second lens according to a modified example.

The planar shape of the second lens 24bm may be, for example, a rhombic shape as shown in FIG. 12. In this case, the second lens 24bm is disposed such that one diagonal of the rhombus is parallel to the first direction. According to the second lens 24bm having the rhombic shape, the width $H2_{max}$ in the first direction (the Y-direction) can be increased compared to the case where the planar shape is a hexagon. Hence, when the secondary light source image G has a high possibility of deviation in the first direction (the Y-direction) in the second lens 24bm, a protrusion of the secondary light source image G from the second lens 24bm along the first direction can be further reduced by employing the rhombic shape described above.

In the embodiment, the projector including the three light modulators 400R, 400G, and 400B has been exemplified; however, the invention can be applied also to a projector that displays a color image with one light modulator. Moreover, a digital mirror device may be used as a light modulator.

An example of applying the illumination device according to the invention to a projector has been shown in each of the embodiments; however, the invention is not limited to this. The illumination device according to the invention can be applied also to a luminaire such as an automobile headlight.

The entire disclosure of Japanese Patent Application No. 2016-240975, filed on Dec. 13, 2016 is expressly incorporated by reference herein.

What is claimed is:

1. An illumination device comprising:
  a plurality of light-emitting elements;
  a collimating optical system on which light emitted from the plurality of light-emitting elements is incident;
  a first multi-lens array on which light emitted from the collimating optical system is incident and which includes a plurality of first lenses;
  a second multi-lens array on which light emitted from the first multi-lens array is incident and which includes a plurality of second lenses;
  a superimposing lens on which light emitted from the second multi-lens array is incident;
  a wavelength conversion element on which light emitted from the superimposing lens is incident; and
  an optical element that separates the light emitted from the superimposing lens into a first light directed to a reflection element and a second light directed to the wavelength conversion element, wherein
  the plurality of second lenses are arranged respectively corresponding to the plurality of first lenses,
  the plurality of first lenses form a plurality of first lens columns,
  a width, in a first direction, of one second lens of the plurality of second lenses has a distribution in a second direction, where the first direction is a direction in which the plurality of first lens columns are arranged and the second direction is a direction orthogonal to the first direction,
  a maximum value of the width of the one second lens is larger than a width, in the first direction, of one first lens of the plurality of first lenses that corresponds to the one second lens,
  the reflection element reflects the first light toward the optical element,
  the wavelength conversion element converts the second light to a third light having different wavelength band from the second light, and
  the optical element combines the first light reflected by the reflection element and the third light.

2. The illumination device according to claim 1, wherein
  a secondary light source image formed on the one second lens has a longitudinal direction, and
  the longitudinal direction is parallel to the first direction.

3. The illumination device according to claim 1, wherein
  each of the plurality of second lenses has a hexagonal planar shape.

4. A projector comprising:
  the illumination device according to claim 1;
  a light modulator that modulates light from the illumination device in response to image information to thereby form image light; and
  a projection optical system that projects the image light.

5. A projector comprising:
  the illumination device according to claim 2;
  a light modulator that modulates light from the illumination device in response to image information to thereby form image light; and
  a projection optical system that projects the image light.

6. A projector comprising:
  the illumination device according to claim 3;
  a light modulator that modulates light from the illumination device in response to image information to thereby form image light; and
  a projection optical system that projects the image light.

7. The illumination device according to claim 1, wherein
  in each column of the plurality of first lens columns, a width, in the first direction, of each of the first lenses in the column is the same.

8. The illumination device according to claim 1, wherein
  in the second direction, a position of each of the first lenses in one of the plurality of first lens columns is different from a position of each of the first lenses in another one of the plurality of first lens columns that is adjacent to the one of the plurality of first lens columns.

* * * * *